US010036780B2

(12) United States Patent
Dewa et al.

(10) Patent No.: US 10,036,780 B2
(45) Date of Patent: Jul. 31, 2018

(54) EVALUATION APPARATUS AND EVALUATION METHOD OF SHEET TYPE CELL

(75) Inventors: Harutada Dewa, Tokyo (JP); Kiyoyasu Hiwada, Tokyo (JP)

(73) Assignee: KABUSHIKI KAISHA NIHON MICRONICS, Tokyo (JP)

(*) Notice: Subject to any disclaimer, the term of this patent is extended or adjusted under 35 U.S.C. 154(b) by 376 days.

(21) Appl. No.: 14/342,870

(22) PCT Filed: Sep. 5, 2011

(86) PCT No.: PCT/JP2011/070182
§ 371 (c)(1),
(2), (4) Date: May 21, 2014

(87) PCT Pub. No.: WO2013/035149
PCT Pub. Date: Mar. 14, 2013

(65) Prior Publication Data
US 2014/0327445 A1    Nov. 6, 2014

(51) Int. Cl.
*G01R 31/36* (2006.01)
*H01M 10/48* (2006.01)
(Continued)

(52) U.S. Cl.
CPC ..... *G01R 31/3627* (2013.01); *G01R 31/3665* (2013.01); *G01R 31/3696* (2013.01);
(Continued)

(58) Field of Classification Search
CPC ............ G01R 31/3627; G01R 31/3665; G01R 31/3696; H01M 10/48
(Continued)

(56) References Cited

U.S. PATENT DOCUMENTS 4,702,564 A * 10/1987 Parker .................... G01D 7/005
324/104
5,053,995 A * 10/1991 Kajimura ................ G11B 9/14
365/118
(Continued)

FOREIGN PATENT DOCUMENTS

CN        101933154 A    12/2010
JP        09-288155      4/1997
(Continued)

OTHER PUBLICATIONS

Page 2 of First Office Action of Korean Patent Application No. 2014-7004981 dated Jul. 18, 2015.
(Continued)

*Primary Examiner* — Robert Grant
*Assistant Examiner* — John Trischler
(74) *Attorney, Agent, or Firm* — Bacon & Thomas, PLLC

(57) ABSTRACT

An electrode probe is brought into contact with a measurement part on an outer surface of at least one of the positive electrode and the negative electrode of a sheet type cell, and quantity of electricity is measured at the measurement part, so as to evaluate the sheet type cell. The electrode probe may be connected to a voltage meter and to a charge source or a discharge source, and the evaluation made by detecting a charge characteristic that changes the cell from a non-charged state to a fully charged state, a discharge characteristic that changes the cell from a fully charged state to the non-charged state, or a measurement voltage of the voltage meter when the cell is in the fully charged state.

14 Claims, 12 Drawing Sheets

(51) Int. Cl.
*H01M 10/04* (2006.01)
*G01R 1/073* (2006.01)

(52) U.S. Cl.
CPC ......... *H01M 10/48* (2013.01); *G01R 1/07314* (2013.01); *H01M 10/0436* (2013.01)

(58) Field of Classification Search
USPC .......................................................... 324/437
See application file for complete search history.

(56) References Cited

U.S. PATENT DOCUMENTS

| | | | | |
|---|---|---|---|---|
| 5,059,895 A * | 10/1991 | Cataldi | .................. | G01D 7/005 324/104 |
| 5,107,206 A * | 4/1992 | Yanagi | ................ | G01R 31/2806 269/71 |
| 5,130,658 A * | 7/1992 | Bohmer | ................ | G01R 13/403 324/435 |
| 5,483,068 A * | 1/1996 | Moulton | ................ | G01J 5/0003 250/334 |
| 5,525,890 A * | 6/1996 | Iwatsu | ................ | G01R 31/3648 320/106 |
| 5,596,278 A * | 1/1997 | Lin | ..................... | H01M 10/488 324/435 |
| 5,681,402 A * | 10/1997 | Ichinose | ........... | H01L 31/02242 136/256 |
| 5,861,324 A * | 1/1999 | Ichinose | ........... | H01L 31/02242 136/256 |
| 5,903,154 A * | 5/1999 | Zhang | ................ | G01R 31/3696 324/437 |
| 5,966,014 A * | 10/1999 | Zhang | ................... | G01R 31/36 324/426 |
| 6,215,311 B1 * | 4/2001 | Miyamoto | ........ | H01M 10/0413 320/166 |
| 6,472,594 B1 * | 10/2002 | Ichinose | ........... | H01L 31/02242 136/256 |
| 6,517,967 B1 * | 2/2003 | Shrim | ................. | H01M 2/0255 429/148 |
| 6,569,564 B1 * | 5/2003 | Lane | .................... | H01M 2/0222 429/129 |
| 6,611,774 B1 * | 8/2003 | Zaccaria | ............ | G01R 31/3648 320/116 |
| 6,828,053 B2 * | 12/2004 | Fly | ..................... | G01N 27/4073 204/401 |
| 6,906,523 B2 * | 6/2005 | Bertness | ............ | G01R 31/3662 324/426 |
| 7,179,553 B2 * | 2/2007 | Murphy | ............... | B01D 65/104 204/421 |
| 7,504,179 B2 * | 3/2009 | Tanjou | ............... | H01M 2/204 429/160 |
| 7,541,817 B2 * | 6/2009 | Nielsen | .................. | G01N 17/02 166/250.05 |
| 7,612,533 B2 * | 11/2009 | Morita | .................. | H02J 7/0016 320/132 |
| 7,612,534 B2 * | 11/2009 | Morita | .................. | H02J 7/0016 320/132 |
| 7,633,267 B2 * | 12/2009 | Kepler | .................. | H01G 11/14 320/150 |
| 7,811,707 B2 * | 10/2010 | Lampe-Onnerud | ... | H01M 4/131 29/623.1 |
| 7,811,708 B2 * | 10/2010 | Lampe-Onnerud | ... | H01M 4/131 29/623.1 |
| 8,004,737 B2 * | 8/2011 | Nakazawa | ............... | G02F 1/015 359/240 |
| 8,288,046 B2 * | 10/2012 | Murphy | ............ | H01M 8/04574 429/428 |
| 8,487,630 B2 * | 7/2013 | Mori | ................... | H01M 10/482 320/116 |
| 8,587,855 B2 * | 11/2013 | Nakazawa | ............... | G02F 1/015 359/240 |
| 8,936,872 B2 * | 1/2015 | Fukumine | ................ | H01M 4/13 429/207 |
| 9,013,139 B2 * | 4/2015 | Pinnell | .................. | H02J 7/0008 320/106 |
| 9,240,696 B2 * | 1/2016 | Renken | ............... | H01M 10/425 |
| 2001/0032666 A1 * | 10/2001 | Jenson | ................. | A61N 1/3787 136/256 |
| 2001/0046081 A1 * | 11/2001 | Hayashi | ................ | G09F 9/372 359/296 |
| 2002/0180445 A1 * | 12/2002 | Bertness | ............ | G01R 31/3662 324/426 |
| 2003/0215702 A1 * | 11/2003 | Tanjou | .............. | H01M 10/4207 429/127 |
| 2004/0048113 A1 * | 3/2004 | Murphy | ............... | B01D 65/104 429/431 |
| 2004/0229111 A1 * | 11/2004 | Kurosawa | ................ | G03B 7/26 429/96 |
| 2005/0074140 A1 * | 4/2005 | Grasso | ..................... | G06T 5/00 382/103 |
| 2006/0001430 A1 * | 1/2006 | Kepler | .................... | H01G 11/14 324/426 |
| 2007/0026315 A1 * | 2/2007 | Lampe-Onnerud | ... | H01M 4/131 429/224 |
| 2007/0210760 A1 * | 9/2007 | Shimamura | ......... | H01M 2/1077 320/135 |
| 2007/0247116 A1 * | 10/2007 | Morita | .................. | H02J 7/0016 320/132 |
| 2007/0247117 A1 * | 10/2007 | Morita | .................. | H02J 7/0016 320/132 |
| 2008/0003492 A1 * | 1/2008 | Bates | .................. | H01M 2/0207 429/66 |
| 2008/0238361 A1 * | 10/2008 | Pinnell | .................... | H02J 7/045 320/107 |
| 2008/0258747 A1 | 10/2008 | Kluth et al. | | |
| 2009/0112099 A1 * | 4/2009 | Kurokawa | ............... | A61B 8/00 600/459 |
| 2009/0181296 A1 * | 7/2009 | Lampe-Onnerud | ... | H01M 4/131 429/160 |
| 2009/0256581 A1 | 10/2009 | Lu et al. | | |
| 2009/0274958 A1 * | 11/2009 | Fukumine | ................ | H01M 4/13 429/207 |
| 2010/0067089 A1 | 3/2010 | Nakazawa | | |
| 2010/0271036 A1 * | 10/2010 | Kishimoto | .......... | B60L 11/1855 324/434 |
| 2011/0005571 A1 | 1/2011 | Yamamuro et al. | | |
| 2011/0059349 A1 * | 3/2011 | Lampe-Onnerud | ... | H01M 4/131 429/156 |
| 2011/0062915 A1 * | 3/2011 | Shin | ...................... | H01M 2/202 320/107 |
| 2011/0084702 A1 * | 4/2011 | Mori | ............... | G01R 31/3679 324/430 |
| 2011/0300667 A1 * | 12/2011 | Nakazawa | ............... | G02F 1/015 438/104 |
| 2012/0288746 A1 * | 11/2012 | Abe | ................ | H01M 2/0287 429/162 |
| 2013/0207618 A1 * | 8/2013 | Renken | ............... | H01M 10/425 320/155 |
| 2015/0042289 A1 * | 2/2015 | Yoshida | ............... | H01M 10/441 320/136 |
| 2015/0109019 A1 * | 4/2015 | Matsuda | ................. | H01L 29/4908 324/762.01 |

FOREIGN PATENT DOCUMENTS

| | | |
|---|---|---|
| JP | 2000-028692 | 1/2000 |
| JP | 2002-042863 | 2/2002 |
| JP | 2003-215190 | 7/2003 |
| JP | 2003-215190 A | 7/2003 |
| JP | 2003-217683 A | 7/2003 |
| JP | 2009-231189 A | 10/2008 |
| JP | 2011-169870 A | 9/2011 |
| TW | 200900708 A | 1/2009 |
| TW | 20100923 A1 | 1/2010 |
| TW | 201044629 A1 | 12/2010 |

(56) References Cited

FOREIGN PATENT DOCUMENTS

| WO | WO2008053561 A1 | 5/2008 |
|---|---|---|
| WO | 2010135321 A2 | 11/2010 |

OTHER PUBLICATIONS

Supplementary European Search Report dated May 4, 2015 in European Appln. No. 11871926.9.
Pamphlet "Identifying Dielectric and Resistive Electrode Losses in High-Density Capacitors at Radio Frequencies"; M.P.J. Tiggelman et al; issued in 2008 IEEE Conference on Microelectronic Test Structure, Mar. 24-27, Edinburgh, UK.
Kijiyama, Hiroshi; "New Development of Semiconductor Secondary Cell (Guala Battery)" Nov. 20, 2010; online: <URL:http://133.41.4055/upload/83/riezon/2010/hp/a-2kajiyama.pdf>.
First Office Action dated Mar. 3, 2014 in Taiwanese Patent Application No. 101112779.

\* cited by examiner

EVALUATION APPARATUS AND EVALUATION METHOD OF SHEET TYPE CELL

TECHNICAL FIELD

The present invention relates to an evaluation apparatus and an evaluation method of a sheet type cell, which can be applied to evaluation of a secondary cell based on an operation principal of forming a new energy level in a band gap and capturing an electron by utilizing a photoexcited structural change of a metal oxide, for example. The term "evaluation" in this description is a term which includes "test", "inspection", and "measurement".

BACKGROUND ART

The conventional secondary cells are chemical type cells in which electricity is stored and an electric current is extracted with movement of ions (electrically charged matter) through a chemical reaction. On the other hand, solar cells and atomic cells are known as physical type cells. Recently, a technology of secondary cells using lithium has been developed (see Patent Document 1).

PRIOR ART DOCUMENT

Patent Document

Patent Document 1: Japanese Patent Laid-Open 2002-42863

DISCLOSURE OF THE INVENTION

Problems to be Solved by the Invention

None of the physical type cells is rechargeable and capable of forming a secondary cell.

In the chemical type secondary cells, as a chemical reaction is used, a charge/discharge performance is lowered, and a life is shortened. If electrolytes are used here, there always exists a risk of leakage.

In lithium ion secondary cells, reliability is reduced because of overcharging and charging/discharging, and there is a risk of fire when a short circuit occurs between electrodes. Possibility of the fire because of the short circuit is reduced by polymerizing or solidifying the electrolytes, but in the existent secondary cells there is a limitation of energy density from 500 to 800 Wh/L. Combinations of metal lithium of a negative electrode and various positive electrodes have been tested to obtain larger capacity. However, the risk of short circuit between the electrodes cannot be avoided because the electrolytes are used. Also, because rare metals such as lithium are used, there are problems of a material cost and procurement.

Therefore, the applicant is researching and developing sheet type (parallel plate type) secondary cells without causing a risk of leakage, generation of heat, or fire etc. due to a short circuit between electrodes and without elements that shorten the life in normal usage, while having higher energy density compared to the conventional chemical type cells. However, in the present circumstances, the sheet type cells are rarely available on the market, and how to evaluate sheet type cells is far from being established.

Therefore, an evaluation apparatus and evaluation method for sheet type cells appropriate for evaluation of sheet type cells are desired.

Means to Solve the Problems

In order to solve the above described problems, a first aspect of the present invention is an evaluation method of a sheet type cell for evaluating the sheet type cell in which a storage layer is sandwiched by layers of a positive electrode and a negative electrode, the evaluation method including the step of bringing an electrode probe into contact with a measuring part on an outer surface of at least one of the positive electrode and the negative electrode, and measuring quantity of electricity at the measurement part, so as to evaluate the sheet type cell.

A second aspect of the present invention is an evaluation apparatus of a sheet type cell for evaluating the sheet type cell in which a storage layer is sandwiched by layers of a positive electrode and a negative electrode, the evaluation apparatus including an electrode probe that is brought into contact with a measuring part on an outer surface of at least one of the positive electrode and the negative electrode, and a measurement evaluation unit that measures quantity of electricity at the measurement part via the electrode probe, so as to evaluate the sheet type cell.

EFFECT OF THE INVENTION

According to the present invention, a sheet type cell in which a storage layer is sandwiched between layers of a positive electrode and a negative electrode can be evaluated.

BEST MODE FOR CARRYING OUT THE INVENTION (A) Main Embodiment

An embodiment of an evaluation apparatus and an evaluation method of a sheet type cell according to the present invention is described below by referring to the attached drawings.

(A-1) Explanation of a Sheet Type Cell which can be an Object to be Evaluated

Figure 1:
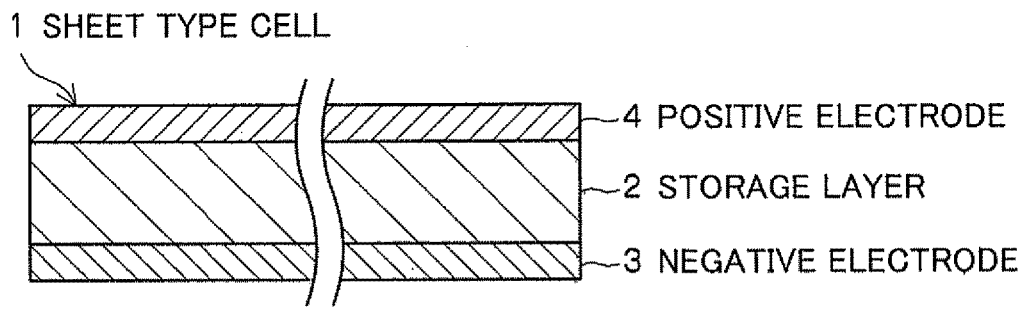
FIG. 1 is an explanatory view showing a basic structure of a sheet type cell which is an object to be evaluated of an evaluation apparatus and an evaluation method according to embodiments.

FIG. 1 is an explanatory view showing a layer structure of a sheet type cell which is an object to be evaluated by an evaluation apparatus and an evaluation method according to the embodiment.

A sheet type cell to be evaluated is not limited to the one which is implemented as a secondary cell, but may be the one which is implemented as a primary cell. Hereinafter, explanation is given supposing that the sheet type cell is a secondary cell. Also, any sheet type (parallel plate type) cell may be an object to be evaluated. For example, as shown in FIG. 1, a solid state sheet type cell 1 in which a storage layer 2 having a function of storing electricity is sandwiched between layers of a positive electrode 4 and a negative electrode 3 may be an object to be evaluated. Furthermore, for example, a solid state lithium cell may also be an object to be evaluated. Also, a sheet type cell with a storage layer in which a photoexcited structural change is utilized may be an object to be evaluated, for example. Moreover, an object to be evaluated may adopt a structure in which a plurality of the sheet type cells 1 of FIG. 1 are layered in series to increase charge voltage, or a structure in which a plurality of the sheet type cells 1 of FIG. 1 are layered in parallel to increase charge capacity.

Hereinafter, a sheet type cell having a storage layer in which a photoexcited structural change is used (hereinafter also referred to as a quantum cell), which may be the object to be evaluated, is briefly described. The storage layer in the quantum cell is referred to as a charging layer, in view of its characteristics.

The charging layer stores electrons with a charging operation, releases the charged electrons with a discharging operation, and keeps the electrons (storage of electricity) in a state without charging/discharging. The charging layer is formed by applying a technology of photoexcited structural change.

The photoexcited structural change is a phenomenon (technology) found out by Akira Nakazawa, who is the inventor of International Patent application JP2006/322011. That is, Akira Nakazawa found out that, when effective excitation energy is applied to an insulation-coated translucent metal oxide which is a semiconductor having a band gap as same as or more than a predetermined number, a lot of energy levels with no electrons are generated in the band gap. The quantum cell is charged by capturing electrons in these energy levels, and discharged by releasing the captured electrons.

In the quantum cell, the positive electrode 4 includes an electrode main body layer and a p-type metal oxide semiconductor layer formed to be in contact with the charging layer 2. The p-type metal oxide semiconductor layer is provided to prevent injection of electrons from the electrode main body layer to the charging layer 2.

The electrode main body layers of the negative electrode 3 and the positive electrode 4 are simply required to be formed as conductive layers.

The charging layer 2 is formed in a way where insulation-coated n-type metal oxide semiconductor particles adhere to the negative electrode 3 in a thin film shape, and is transformed to be capable of storing electrons with a photoexcited structural change caused at the n-type metal oxide semiconductor by ultraviolet irradiation.

Figure 2:
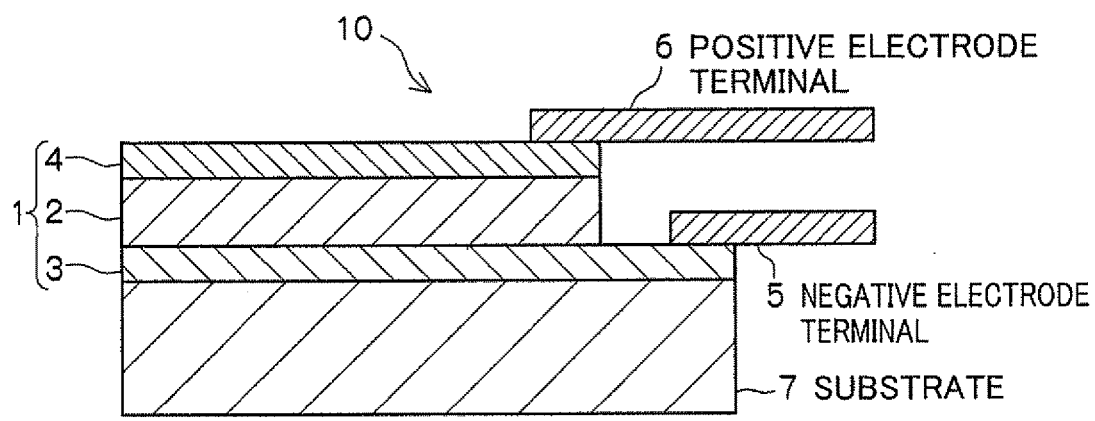
FIG. 2 is an explanatory view showing a sheet type cell to be evaluated attached with a positive electrode and a negative electrode.

(A-2) Evaluation Methods for Sheet Type Cells to be Evaluated as an Extension of Prior Arts and their Problems As described above, FIG. 1 shows a basic configuration of the sheet type cell 1 to be evaluated. FIG. 2 shows a secondary cell device 10, in which the sheet type cell 1 is provided on a substrate 7 that is used as a support, and a negative electrode terminal 5 and a positive electrode terminal 6 are attached to the negative electrode 3 and the positive electrode 4 of the sheet type cell 1 respectively.

It is intended that the evaluation method and the evaluation apparatus according to this embodiment, which will be described in detail later, are mainly applied to inspection during a production process. The inspection can be conducted by the evaluation method and the evaluation apparatus according to this embodiment without attaching the negative electrode terminal 5 and the positive electrode terminal 6, and the inspection can also be conducted after attaching the negative electrode terminal 5 and the positive electrode terminal 6.

It may be possible to conduct inspection for detecting a charging/discharging characteristic of the secondary cell device 10, to which the negative electrode terminals 5 and the positive electrode terminal 6 are attached, similarly to the inspection of other secondary cells.

Figure 3:
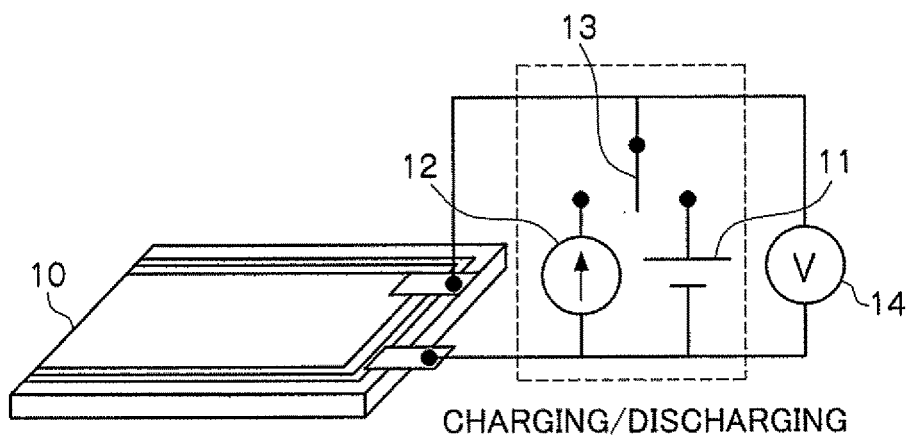
FIG. 3 is an explanatory view showing a case in which a conventional evaluation method of a conventional evaluation apparatus is applied to the sheet type cell of FIG. 2.
Figure 4:
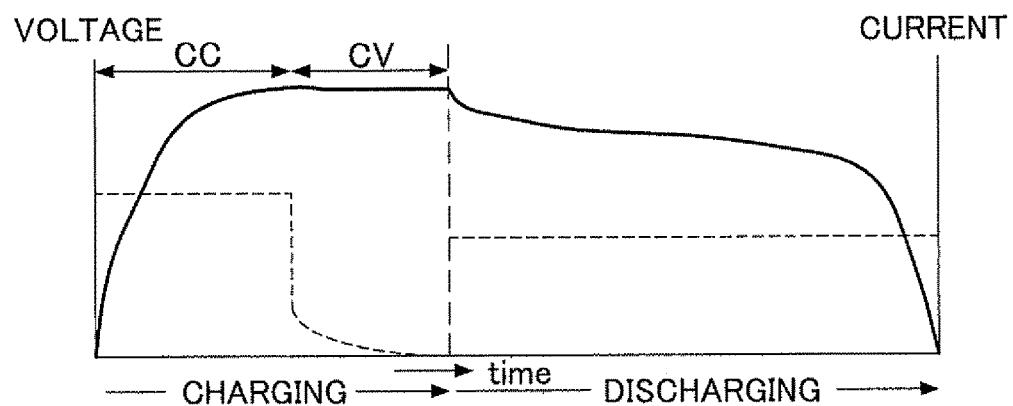
FIG. 4 is an explanatory view showing a general method for evaluating a charging/discharging characteristic of a sheet type cell.

For example, as shown in FIG. 3, a voltage source (or a current source) 11 for supplying a charge current and a current source 12 for extracting a discharge current are allowed to be connected alternatively between the positive electrode terminal 6 and the negative electrode terminal 5 via a switch 13, and a voltage meter (a digital voltage meter (DVM), for example) 14 for detecting a voltage between the terminals during the charging and the discharging is provided. It is to be noted that an ammeter for detecting the charge current or an ammeter for detecting the discharge current may be provided separately. Then, a charging time CC+CV (where CC is a charging time with constant current charging and CV is a charging time with constant voltage charging) that is shown in FIG. 4, for example, and that is needed from a non-charged state until a fully charged state, and a discharging time that is needed from the fully charged state until the non-charged state are measured by the inspection, so as to evaluate the secondary cell device 10 (that is, the sheet type cell 1).

The secondary cell device 10 (that is, the sheet type cell 1) has a layer structure, and is practically formed in a plate shape. When there is an abnormality in the charging/discharging characteristics in such a layer structure, it is necessary to disassemble (or break) the sheet type cell 1 as the object, so as to analyze and examine its inner part unless its cause appears on the surface or on the outer part. When the defect is in the inner part, the inner part can be hardly examined optically, unless the electrode is transparent, and special means using X-rays, β-rays or the like is required in order to examine the inner part nondestructively. In other words, it is difficult to identify the abnormal part, and the special means and the like are required for the identification.

The evaluation apparatus and the evaluation method according to this embodiment are made in view of the above-described circumstances.

(A-3) Evaluation According to this Embodiment

The evaluation method according to this embodiment is to measure an electric characteristic value (a voltage, for example) by bringing the probe into contact with an arbitrary part on the surface of the positive electrode 4 of the sheet type cell 1, and to identify the abnormal part from the measurement result, if there is the abnormality such as the defect. A requirement for this embodiment is to probe the surface of the positive electrode 4, and this embodiment is applicable when probing can be made on the arbitrary part on the positive electrode 4 of the sheet type cell 1. Here, the probing means that the probe is electrically brought into contact with a contact part.

Figure 17:
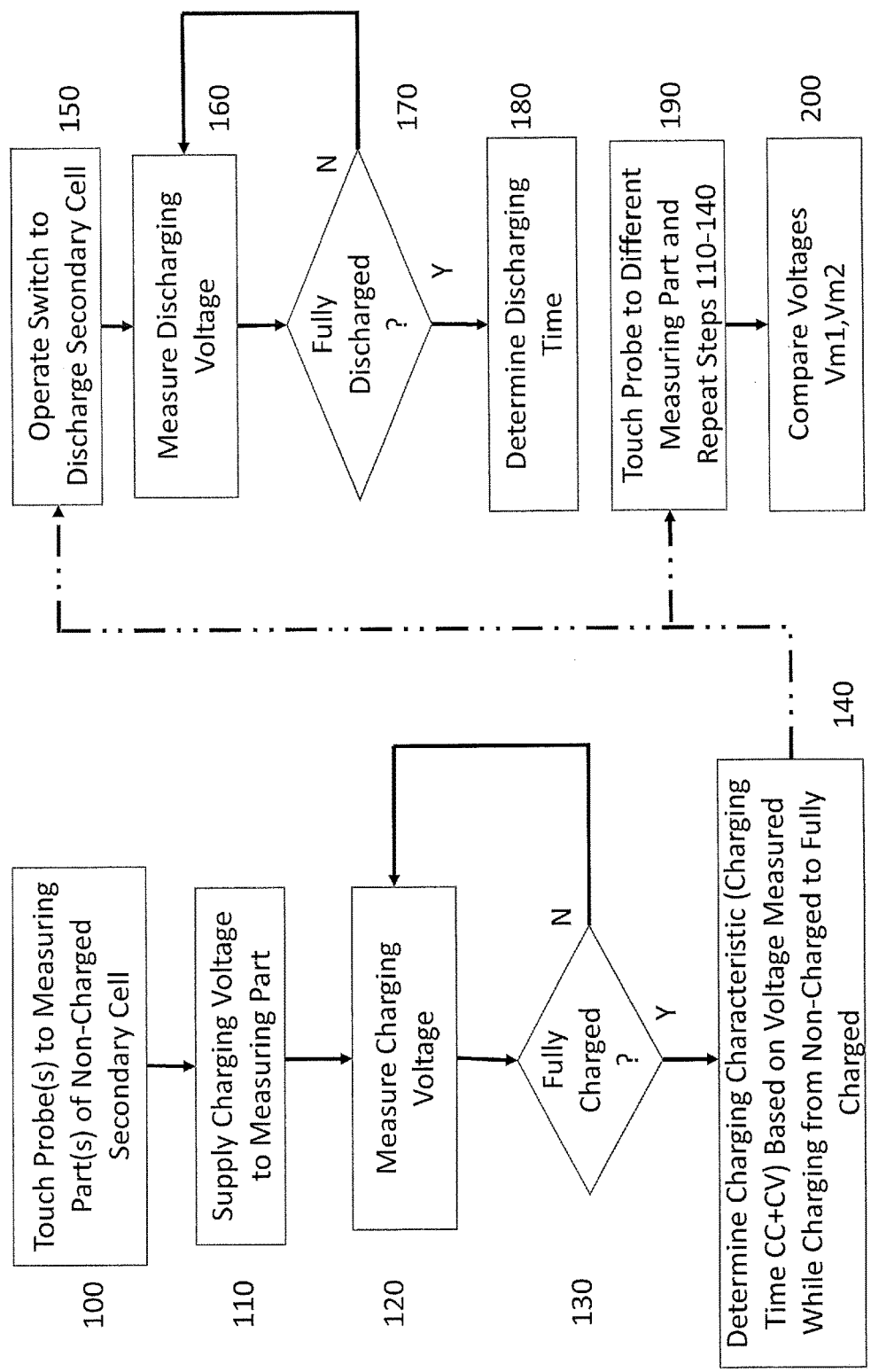
FIG. 17 is a flowchart summarizing the method of FIGS. 13-15, utilizing the apparatus illustrated in FIGS. 5-12 and 16.

Hereinafter, an explanation will be given to the case where the evaluation is made by bringing the probe into contact with the arbitrary part on the surface of the positive electrode 4 of the sheet type cell 1 and measuring the electric characteristic value, as illustrated in the flowchart of FIG. 17, which includes the steps of touching one or more probes to areas of the secondary cell (step 100); supplying a charging voltage to the secondary cell via the probe and measuring part (step 110); detecting a fully charged state of the secondary cell based on the changes in the charging voltage (steps 120 and 130), and determining a charging characteristic based on voltage measured while charging from a non-charged to fully charged state (step 140). However, when the surface of the negative electrode 3 of the sheet type cell 1 is exposed to the outside, such as when the sheet type cell 1 is removed from the substrate, the evaluation may be made by bringing the probe into contact with an arbitrary part on the surface of the negative electrode 3 and measuring the electric characteristic value, or the evaluation may be made by bringing the probe into contact with the arbitrary parts on the surfaces of the positive electrode 4 and the negative electrode 3 and measuring the electric characteristic value.

Figure 5:
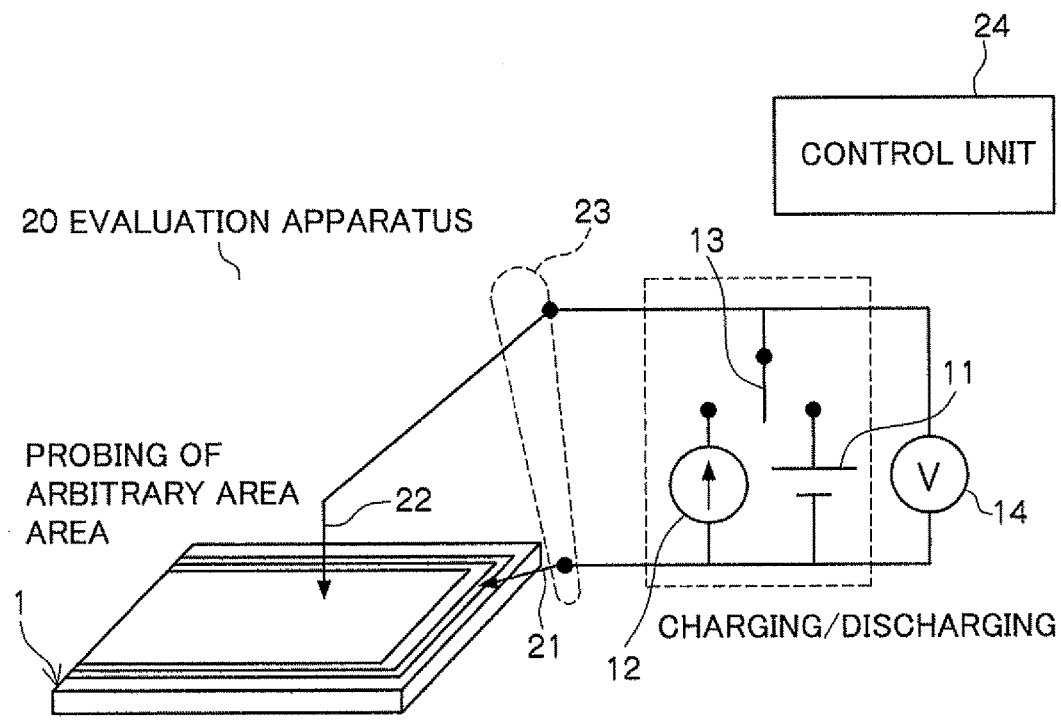
FIG. 5 is an explanatory view showing a schematic configuration of the evaluation apparatus according to the embodiments.

FIG. 5 is an explanatory view showing the configuration of an essential part of the evaluation apparatus according to this embodiment, and the same or corresponding numerals and symbols will be used to designate the same or corresponding components as those in FIG. 3. The sheet type cell inspected by the evaluation apparatus according to this embodiment may be the one with the positive electrode terminal and the negative electrode terminal attached, or the one without the positive electrode terminal and the negative electrode terminal attached. The sheet type cell 1 as shown in FIG. 5 is the one without the positive electrode terminal and the negative electrode terminal attached.

In addition to the voltage source (or the current source) 11, the current source 12, the switch 13, and the voltage meter 14 that are described above, an evaluation apparatus 20 according to this embodiment includes a first probe 21 that is brought into contact with the negative electrode 3, a second probe 22 that is brought into contact with the arbitrary part on the positive electrode 4, a probe moving mechanism 23 that moves the probes 21 and 22 and brings them into a contact state or a non-contact state, and a control unit (that is formed by a personal computer, for example) 24 that allows power supply of the voltage source 11, current extraction by the current source 12, switching of the switch 13, acquisition of a measurement value from the voltage meter 14, movement control of the probe moving mechanism 23, and the like.

It is to be noted that the negative electrode 3 has an area where a storage layer 2 and the like are not provided thereon so as to enable the connection of the negative electrode terminal, for example (refer to FIG. 2), and the first probe 21 is capable of being brought into contact with that area. When the sheet type cell 1 to be evaluated is not attached to the substrate 7, the first probe 21 may also be capable of being brought into contact with the arbitrary part on the negative electrode 3.

Although FIG. 5 shows the one that is provided with only one second probe 22 to be connected to the positive electrode 4, an installation method of the probe for selectively forming a charging path or a discharging path to/from a plurality of parts on the positive electrode 4 is not limited to the one shown in FIG. 5. For example, a plurality of second probes that are connected to different parts on the positive electrode 4 may be provided, and one probe may be selected out of the plurality of probes so as to form the charging path or the discharging path. This variant embodiment will be described in detail in "Other embodiments" that will be described later.

In the inspection of the charging/discharging characteristic, the control unit 24 first allows the voltage source (or the current source) 11 to be connected to the negative electrode 3 and the positive electrode 4 via the switch 13, and allows the time to pass so that a voltage between both ends becomes constant, so as to attain the fully charged state, as represented in FIG. 17 by steps 100 to 130. Then, in this state, the control unit 24 allows the switch 13 to be connected to the current source 12 (step 150 in FIG. 17), causes the discharging by allowing a current to flow in the direction opposite to the direction during the charging, and at the same time, measures the voltage between both ends (steps 160 and 170). In other words, the charging/discharging characteristic can be inspected similarly to the conventional cases. For example, the charging time from the non-charged state until the fully charged state and the discharging time from the fully charged state to the non-charged state are measured by the inspection (respective steps 140 and 180), so as to evaluate the sheet type cell 1. The evaluation may be made by an evaluator. Instead, the evaluation of the charging/discharging characteristic may be made by the control unit 24 by determining whether the measured charging time is within a previously-set normal range or not, and determining whether the measured discharging time is within a previously-set normal range or not.

The inspection of the charging/discharging characteristic may be made on only one spot (gravity center of a contour, for example) that is arbitrarily selected on the positive electrode 4, or may be made respectively on a plurality of spots on the positive electrode 4. In the latter case, the sheet type cell 1 to be evaluated may be determined as normal when all the spots are evaluated as normal.

The evaluation configuration as shown in FIG. 5 may be applied to identify the abnormal part. FIG. 6 are explanatory views of a principle of identifying the abnormal part. Here, the evaluation for identifying the abnormal part may be made when the evaluation result of the charging/discharging characteristic is no good, or may be made irrespective of the evaluation result of the charging/discharging characteristic. As illustrated in FIG. 17, the identification of abnormal parts may be accomplished by touching the probe to different measuring parts and carrying out a charging characteristic determination for each part (step 190), and by comparing charging voltages for the respective parts (step 200). The lack of uniformity in charging voltages for different measuring parts may be used to locate defects in the secondary cell.

Figure 6A:
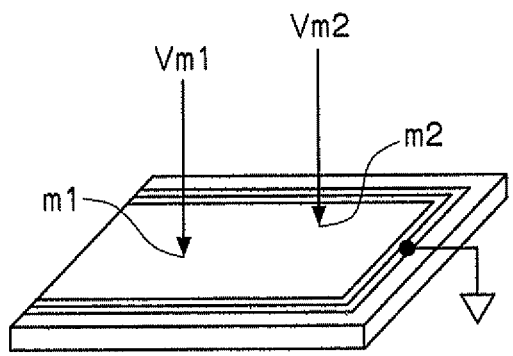
FIG. 6 are explanatory views showing an evaluation method based on voltages of measuring two parts using a probe in the evaluation apparatus according to the embodiments.
Figure 6B:
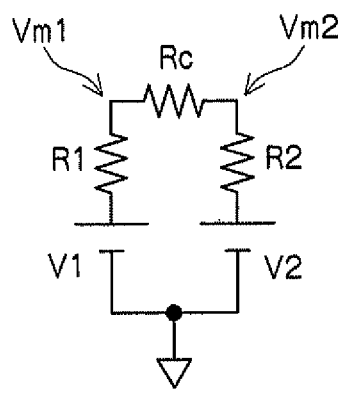

As shown in FIG. 6(A), when the switch 13 is opened after the charging and the voltage is measured at arbitrary two spots of m1 and m2 on the positive electrode 4 with no load, voltages Vm1 and Vm2 that are different from each other are measured unless the sheet type cell 1 operates ideally. FIG. 6(B) shows an equivalent circuit of the sheet type cell 1 when the probing is made at the two spots. The voltages of the arbitrary spots m1 and m2 are represented by charged voltages V1 and V2 (which may be also referred to as electromotive voltages; but the electromotive voltages change over time due to the discharging and the like) when the sheet type cell 1 side (the negative electrode 3 side) is seen from the spots m1 and m2, and internal resistances R1 and R2. The measurement voltage Vm1 at the spot m1 in FIG. 6 is represented by the electromotive voltage V1 and the internal resistance R1 and is divided via an equivalent resistance Rc on the positive electrode 4, as in expression (1). The measurement voltage Vm2 at the spot m2 is represented by the electromotive voltage V2 and the internal resistance R2 and is divided via the equivalent resistance Rc on the positive electrode 4, as in expression (2). It is to be noted that a resistance value of the negative electrode 3 is sufficiently small as compared with a resistance value of the positive electrode 4 and the internal resistance, and is approximated as being ignorable, for the sake of simplicity.

$$Vm1=\{(Rc+R2)\times V1+R1\times V2\}/(R1+Rc+R2) \quad (1)$$

$$Vm2=\{(Rc+R1)\times V2+R2\times V1\}/(R1+Rc+R2) \quad (2)$$

The charge voltage measurement operation at the two spots, as described above, makes it possible to find out the characteristics and the abnormality of the electromotive voltages and the internal resistances at the measurement spots. When, for example, the respective layers of the sheet type cell 1 are formed normally and uniformly, the measurement voltages Vm1 and Vm2 at the arbitrary two spots m1 and m2 are almost equal to each other, and have the values according to the equivalent resistance Rc at the stable time, as is clear from the expression (1) and the expression (2). The positive electrode 4 is usually formed by a uniform metal film and the equivalent resistance Rc is stable. However, when there is a crack or the like between the measurement spots m1 and m2, for example, the value of the equivalent resistance Rc is increased equivalently, which causes abnormal values in the measurement voltages Vm1 and Vm2. In addition, when the charging layer 2 is generated differently between the arbitrary two spots m1 and m2, and when the electromotive voltages V1 and V2 are significantly different from each other, a significant difference is also caused between the measurement voltages Vm1 and Vm2. It is to be noted that, when the sheet type cell is in a completely broken state (dead state), the measurement voltages Vm1 and Vm2 become zero equally (the measurement voltages Vm1 and Vm2 become equal to each other).

It is to be noted that when the expression (1) and the expression (2) can be rearranged with respect to the electromotive voltages V1 and V2, and the rearranged expressions are applied, it is clear that the electromotive voltages V1 and V2 can be calculated from the measurement voltages Vm1 and Vm2 at the two spots. This means that the states of the charge voltages V1 and V2 can be figured out from the measurement voltages Vm1 and Vm2.

Here, when the substrate 7 is not provided on the negative electrode 3 side, and when electrical probing is made similarly to the positive electrode 4, the principle of operation similar to the above can also be applied (refer to FIG. 8 as will be described later).

When the evaluation of the charging/discharging characteristic at each of the arbitrary spots, and the evaluation based on the relationship of the measurement voltages of the electromotive voltages (charge voltages) at the plurality of spots, as described above, are made at the multiple spots, it is possible to perform the characteristic evaluation and the abnormality detection over the entire surface of the sheet type cell 1. This embodiment aims at the multi-spot inspection as described above.

Hereinafter, it is demonstrated from a simulation result that the evaluation of the sheet type cell 1 can be made from the measurement voltages (Vm1 and Vm2) at the arbitrary parts, with reference to FIG. 7 to FIG. 9.

Figure 7:
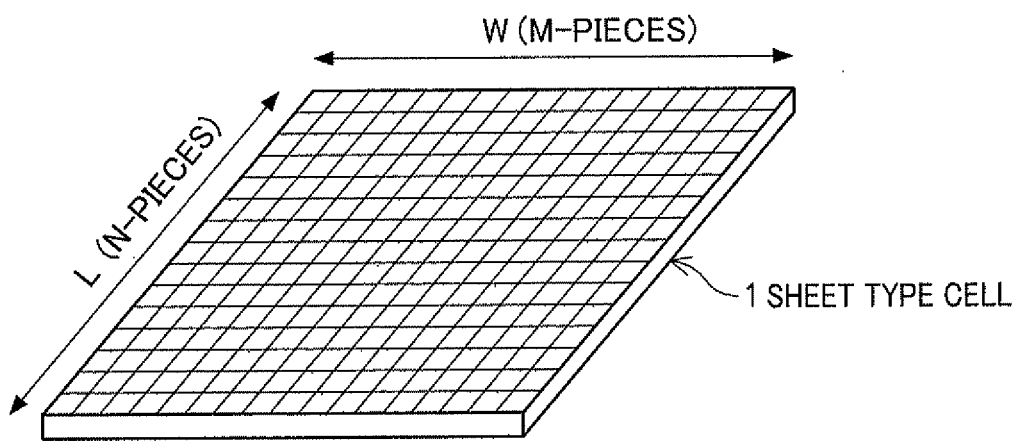
FIG. 7 is an explanatory view showing a manner of dividing an evaluated sheet type cell into imaginary elements.

It is assumed that the sheet type cell 1 to be evaluated is equally divided into N-pieces in the vertical direction and is equally divided into M-pieces in the horizontal direction, as shown in FIG. 7, so as to obtain elements having the total number of N×M with the same configuration. In other words, it is assumed that the N×M elements having the same configuration are combined to form the sheet type cell 1 to be evaluated. Moreover, it is assumed that the centers of the positive electrode 4 and the negative electrode 3 of each of the elements are the parts where the probes are brought into contact therewith. Under such assumptions, the equivalent circuit of each of the elements can be shown as FIG. 8.

Figure 8:
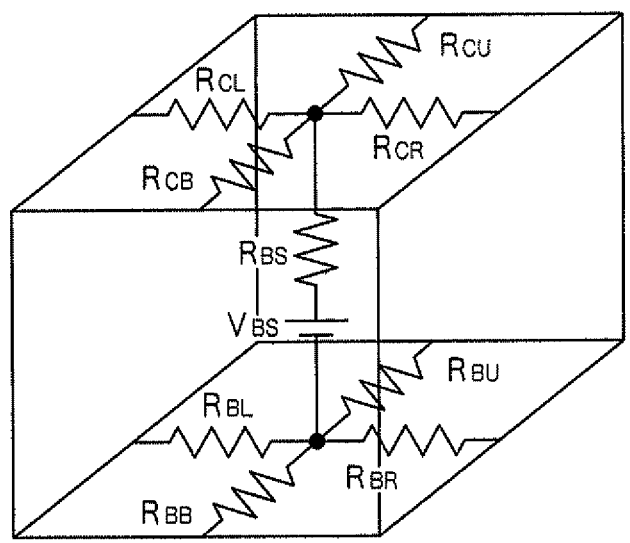
FIG. 8 is an explanatory view showing an equivalent circuit of the imaginary elements in FIG. 7.

In FIG. 8, VBS and RBS represent the electromotive voltage (charge voltage) and the internal resistance of the element, respectively. RCU and RCB represent resistance components of the positive electrode on the far side and on the near side from the center of the positive electrode 4 in the vertical direction, respectively, and RCL and RCR represent resistance components of the positive electrode on the left side and on the right side from the center of the positive electrode 4 in the horizontal direction, respectively. In addition, RBU and RBB represent resistance components of the negative electrode on the far side and on the near side from the center of the negative electrode 3 in the vertical direction, respectively, and RBL and RBR represent resistance components of the negative electrode on the left side and on the right side from the center of the negative electrode 3 in the horizontal direction, respectively.

By applying the equivalent circuit (circuit model) of the element as described above, the simulation for identifying the abnormal part in the sheet type cell 1 is performed.

Figure 9:
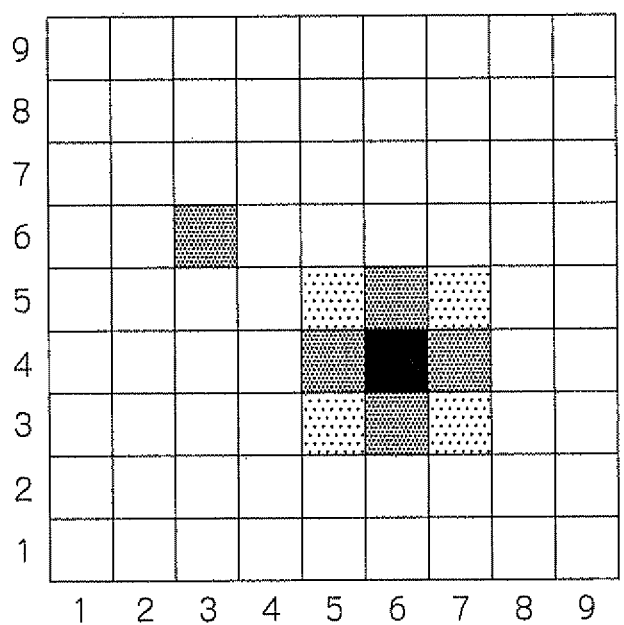
FIG. 9 is an explanatory view showing the results of simulations in which the equivalent circuit of FIG. 8 is applied to simulate a measured voltage of each element when there is a charge voltage defect.

FIG. 9 shows the result of the simulation about how the measurement voltage of the positive electrode 4 of each of the elements will be, when there is a defect in the sheet type cell 1. FIG. 9 shows the case where the sheet type cell 1 is a quantum cell, and the sheet type cell 1, having the length L being 36 mm in the vertical direction and the length W being 37 mm in the horizontal direction, is divided into 9 pieces both in the vertical direction and in the horizontal direction. Further, FIG. 9 shows the case where the negative electrode 3 is made of copper and has the thickness of its layer being 0.3 µm, and the positive electrode 4 is made of copper and has the thickness of its layer being 0.3 µm. Furthermore, it shows the case where the internal resistance RBS of the storage layer (charging layer) 2 in each of the elements is 81Ω (the internal resistance of the storage layer 2 as a whole is 1Ω as the internal resistances being 81 pieces in total are connected in parallel), and the charge voltage VBS of the storage layer 2 in each of the elements is 2.0 V (ideal value). It is to be noted that it shows the case where the charge voltage VBS of the element that is the sixth in the X direction (horizontal direction) and the fourth in the Y direction (vertical direction) is 0 V (large defect), and the charge voltage VBS of the element that is the third in the X direction (horizontal direction) and the sixth in the Y direction (vertical direction) is 1 V (small defect).

FIG. 9 shows the result of calculation of the voltages of the respective elements on the upper surface of the positive electrode 4, under the assumptions as described above, with greyscale range equal to 1 mV (white to black). The voltage drops at the part (element) where the large defect or the small defect exists, and the voltages on the periphery follow the voltage of the defected part. Thus, the calculation result according to the principle of operation as explained with reference to FIG. 6 is obtained. The voltage of the calculation result corresponds to the measurement voltage at a predetermined spot in the evaluation apparatus. Namely, the voltage at the predetermined spot is measured by bringing the probe into contact therewith, and the abnormal part can be identified from a difference between the measurement voltage and the ideal value, and a measurement voltage distribution.

The above description focuses on the charge voltage VBS and explains the calculation result when there is no abnormality in the internal resistances RBS of the respective elements of the storage layer 2. As is clear from the above-described expression (1) and the expression (2), when the internal resistances RBS of the respective elements of the storage layer 2 (corresponding to R1 and R2 in the respective expressions) have the abnormality, it affects the voltage (measurement voltage) on the upper surface of the respective elements of the positive electrode 4, similarly to the above.

Figure 10:
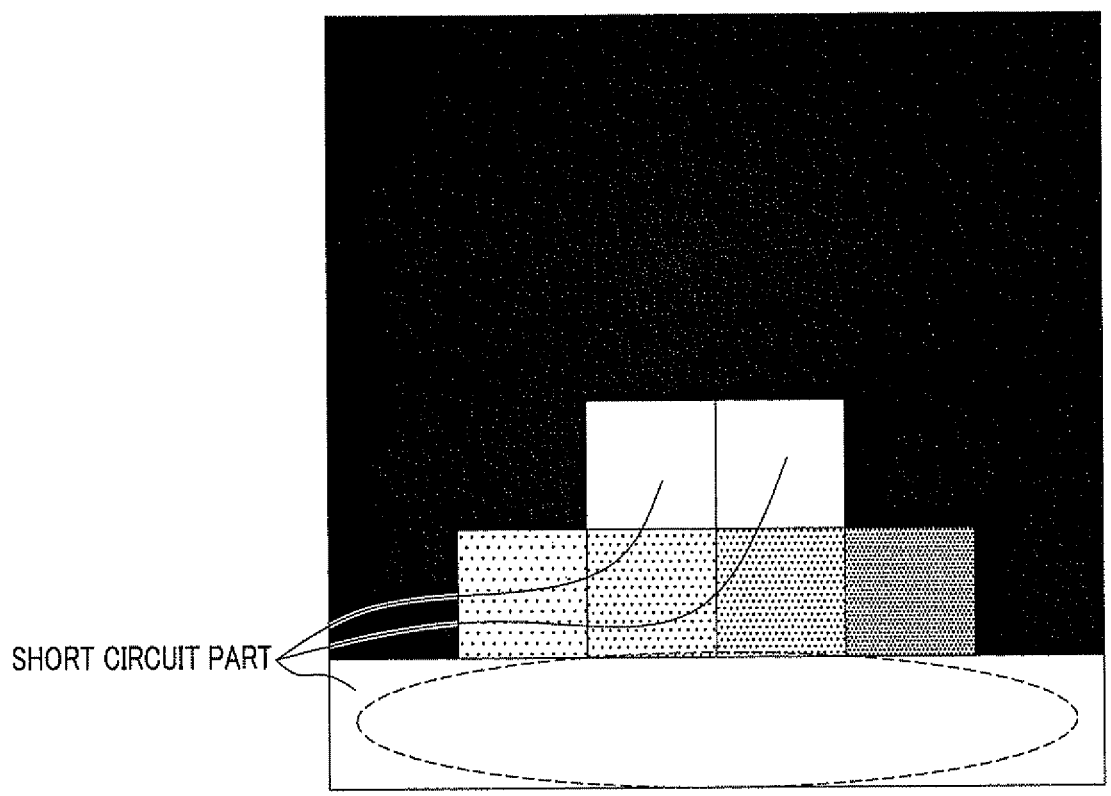
FIG. 10 is an explanatory view showing the measured voltage of each element in a prototype with a defect in internal resistance in a grayscale.

An actual prototype of the quantum cell having the size of 30 mm×30 mm is used as the sheet type cell 1, divided lengthwise and widthwise into 6×6 pieces, and subjected to the voltage measurement. As this prototype has a fault of a dead short circuit (internal resistance is 0Ω) and has a small power capacity, the voltage is measured by giving a voltage of about 1 V from the outside and probing the respective elements. FIG. 10 shows differences between an average value of the measurement voltages at the 36 parts and the measurement values of the respective elements in a greyscale. When comparing it with the actual prototype, it is found out that there is good correspondence between the part where the measurement voltage is low and an area where the short circuit is considered to be caused (an area surrounded by a broken line).

In addition, when a distance and an electric potential difference between the measured two spots are made clear, it is possible to calculate a current flowing therebetween.

Methods exemplified below may be adopted as an output method of the inspection result according to the evaluation apparatus of this embodiment, for example.

The measurement value and a measurement process value (a difference from the average value of the measurement values, for example) for each of the elements are displayed or printed out as it is. The measurement value and the measurement process value for each of the elements are converted into scales where the measurement value and the measurement process value belong, so as to obtain a greyscale image as those displayed in FIG. 9 and FIG. 10, and the greyscale image is displayed or printed out. The measurement value and the measurement process value for each of the elements are compared with threshold values or the like, so as to obtain a binary image representing the normality and the abnormality, and the binary image is displayed or printed out.

(A-4) Effect of Embodiment

According to the above-described embodiment, the evaluation is made by bringing the probe into contact with the positive electrode and by measuring the quantity of electricity. Accordingly, it is possible to easily evaluate the sheet type cell to be evaluated without destruction, and to identify the abnormal part, if any.

(B) Other Embodiments (B-1) According to the above-described embodiment, the explanation is given to the case where the evaluation is made by measuring the voltage at the arbitrary two spots on the sheet type cell 1 to be evaluated (refer to FIG. 6). Instead of this case, or in addition to this case, the evaluation may be made by connecting an ammeter to the arbitrary two spots on the sheet type cell 1 to be evaluated.

Figure 11A:
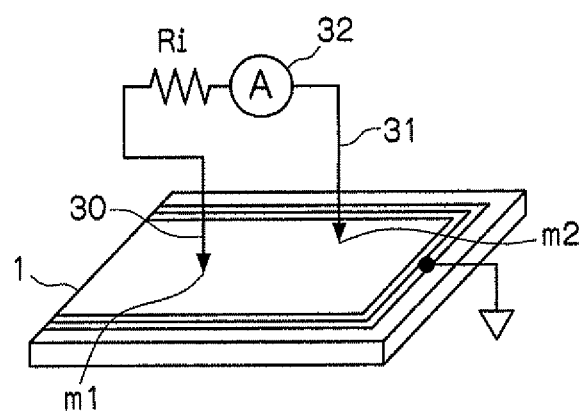
FIG. 11 are explanatory views showing an evaluation method based on an electric current flowing between two probes in the evaluation apparatus according to the embodiments.
Figure 11B:
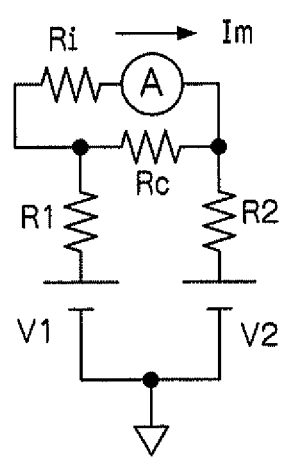

FIG. 11(A) is an explanatory view showing a connection method of the ammeter. Two probes 30 and 31 are connected to the arbitrary two spots m1 and m2 on the positive electrode 4 of the sheet type cell 1. Base end sides of the probes 30 and 31 are connected in series via an ammeter 32 (having an internal resistance value of Ri). An equivalent circuit having such a connection state is shown in FIG. 11(B). It is to be noted that V1, V2, R1, R2 and Rc in FIG. 11(B) are the same as those shown in FIG. 6(B), respectively. A current value Im flowing through the ammeter 32 is represented by the expression (3).

$$Im = \{Rc//Ri/(R1 + Rc//Ri + R2)\} \times \{(V1 - V2)/Ri\} \quad (3)$$

where $Rc//Ri = Rc \times Ri/(Rc + Ri)$

When the internal resistance value Ri of the ammeter 32 is known, the measurement current value Im, the internal resistances R1 and R2, and the electromotive voltages (charge voltages) V1 and V2 at the respective spots m1 and m2 are associated with each other, as represented in the expression (3). In other words, a characteristic test and internal inspection are made possible by measuring the voltage. Particularly, when the highly sensitive ammeter, such as a galvanometer, is applied, it is possible to accurately find out the direction of a current flowing on the surface of the positive electrode 4.

Figure 12:
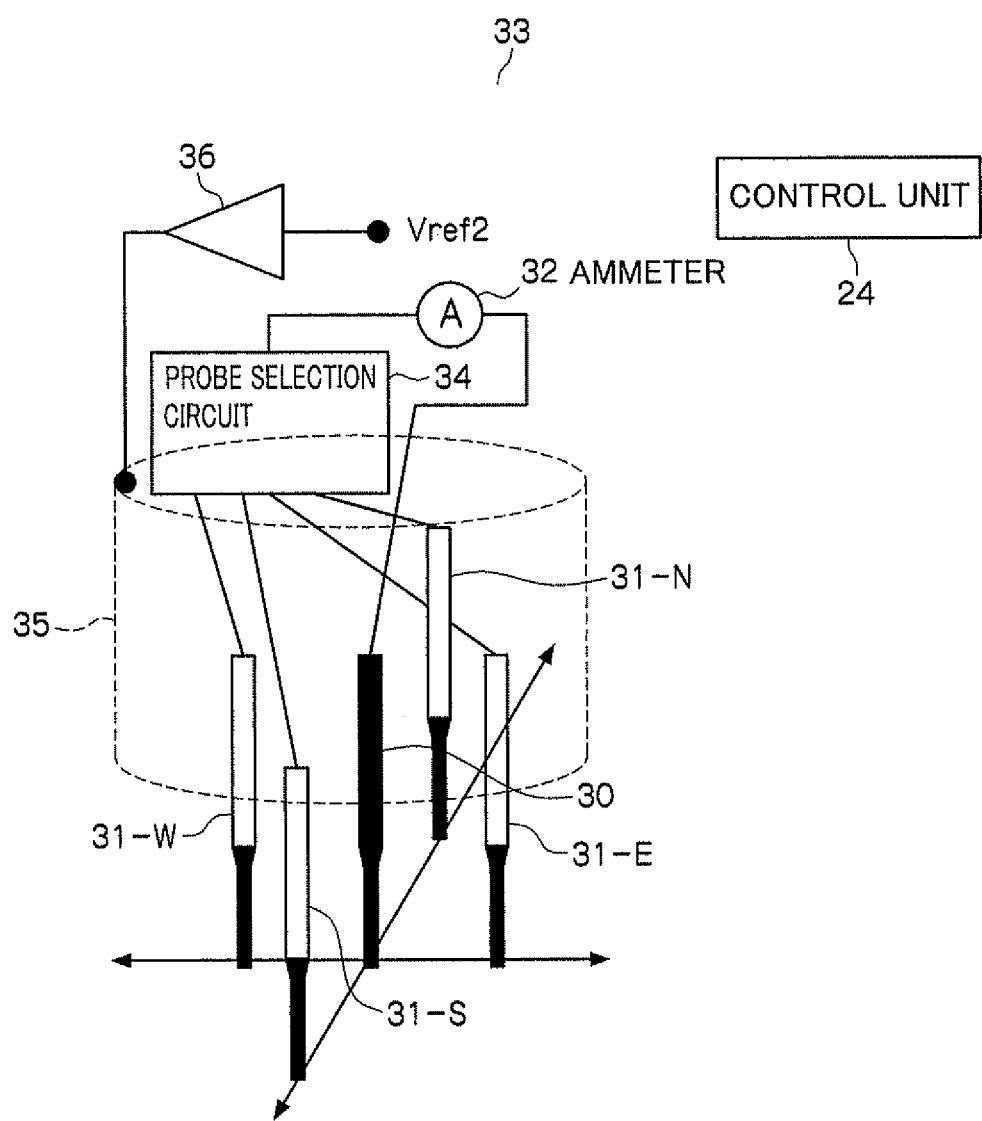
FIG. 12 is an explanatory view showing an evaluation apparatus which is a variation of FIG. 11 to detect a direction in which an electrical current flows.

(B-2) FIG. 12 shows a schematic configuration of an evaluation apparatus 33 that focuses on the direction of a current and facilitates the detection of the defect and the abnormality. Here, the same numerals and symbols will be used to designate the same or corresponding components as those in FIG. 11.

The probe 30 is brought into contact with the measurement part, and probes 31-N, 31-E, 31-S, and 31-W are respectively brought into contact with spots in four directions, each having an equal distance from the contact spot of the probe 30 as the center. Base ends of the probes 31-N, 31-E, 31-S, and 31-W are connected to a probe selection circuit 34. The probe selection circuit 34 selects only one probe out of the probes 31-N, 31-E, 31-S, and 31-W under the control of the control unit 24. One end of the ammeter (galvanometer, for example) 32 is connected to a base end of the probe 30, and the other end of the ammeter 32 is connected to a common terminal of the probe selection circuit 34. The control unit 24 allows the probes 31-N, 31-E, 31-S, and 31-W to be selected alternatively and cyclically, so as to measure a current flowing between the probe 30 and any of the surrounding probes 31-N, 31-E, 31-S, and 31-W and, from the current measurement value, to find out the direction of a current flowing through the spot of the center probe 30 in the most probable manner.

In order to prevent an error current value from entering the current measurement value due to a difference between an electric potential of each of the probes 30, 31-N, 31-E, 31-S, and 31-W and an electric potential of a surrounding member or the like, it is desirable that a predetermined electric potential Vref2 (an ideal electric potential that the probe 30 may have, for example) is applied to a surrounding member 35 or the like of the probes 30, 31-N, 31-E, 31-S, and 31-W via a buffer amplifier 36 or the like, so as to prevent the current (error current) due to the difference with the electric potential of the surrounding member 35, which should not be measured, from flowing to the ammeter 32. In other words, it is desirable to perform guarding.

It is also possible to enhance spatial resolution further by increasing the number of the directions than that of the configuration of FIG. 12.

Figure 13:
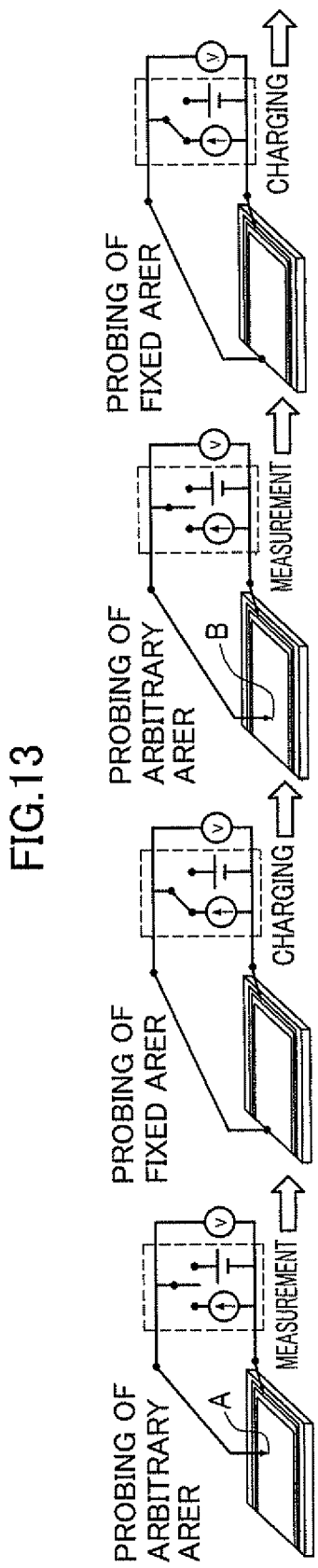
FIG. 13 is an explanatory view showing a method (1) for appropriately detecting a defected part from a plurality of voltage measurement parts in the evaluation apparatus according to the embodiments.

(B-3) According to the explanation of the principle of the evaluation operation of the above-described embodiment, the explanation is given to the voltage measurement after the charging (refer to FIG. 6). With the actual sheet type cell (the quantum cell in this case) 1, the electromotive voltages at the respective parts converge to the lowest electromotive voltage over time after the charging (electromotive voltage uniformity). This is because, as many different electromotive voltages exist inside the sheet type cell 1, a current flows from the higher voltage to the lower voltage, and the discharging is caused inside until the voltages become the lowest voltage. In order to perform measurement at a plurality of spots with a limited number of probes, "full charge→the measurement at the spot A→the full charge→the measurement at the spot B . . . " may be repeated as shown in FIG. 13. That is, the measurement should be always made immediately after the full charge while internal mutual discharging as described above does not proceed. The charging between the measurements does not take much time as the charging is not performed from an empty state, and therefore the measurement time is not increased aimlessly even though the charging for making the fully charged state is performed before the measurement.

Figure 14:
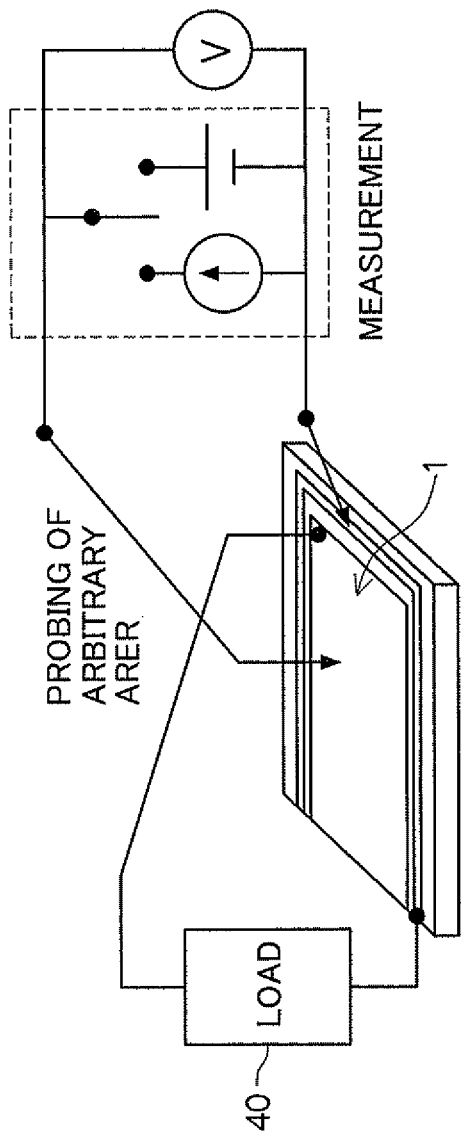
FIG. 14 is an explanatory view showing a method (2) for appropriately detecting a defected part from a plurality of voltage measurement parts in the evaluation apparatus according to the embodiments.

(B-4) Such inconvenience that the original difference in the voltages at the respective measurement parts is difficult to be detected as the electromotive voltages become uniform over time may be avoided by the voltage measurement with a load connected, instead of the voltage measurement immediately after the full charge as described above. Namely, when a known load (a current source or a constant resistance) 40 is connected to the sheet type cell 1, as shown in FIG. 14, the discharging to the external load 40 starts, and the balanced state inside the sheet type cell 1 collapses, even after the electromotive voltages temporarily converge to the lowest electromotive voltage due to the internal discharge. When the voltage is measured by probing the arbitrary spot, it is possible to detect the difference between the voltages at the respective measurement parts, similarly to the above-described measurement immediately after the full charge.

Figure 15:
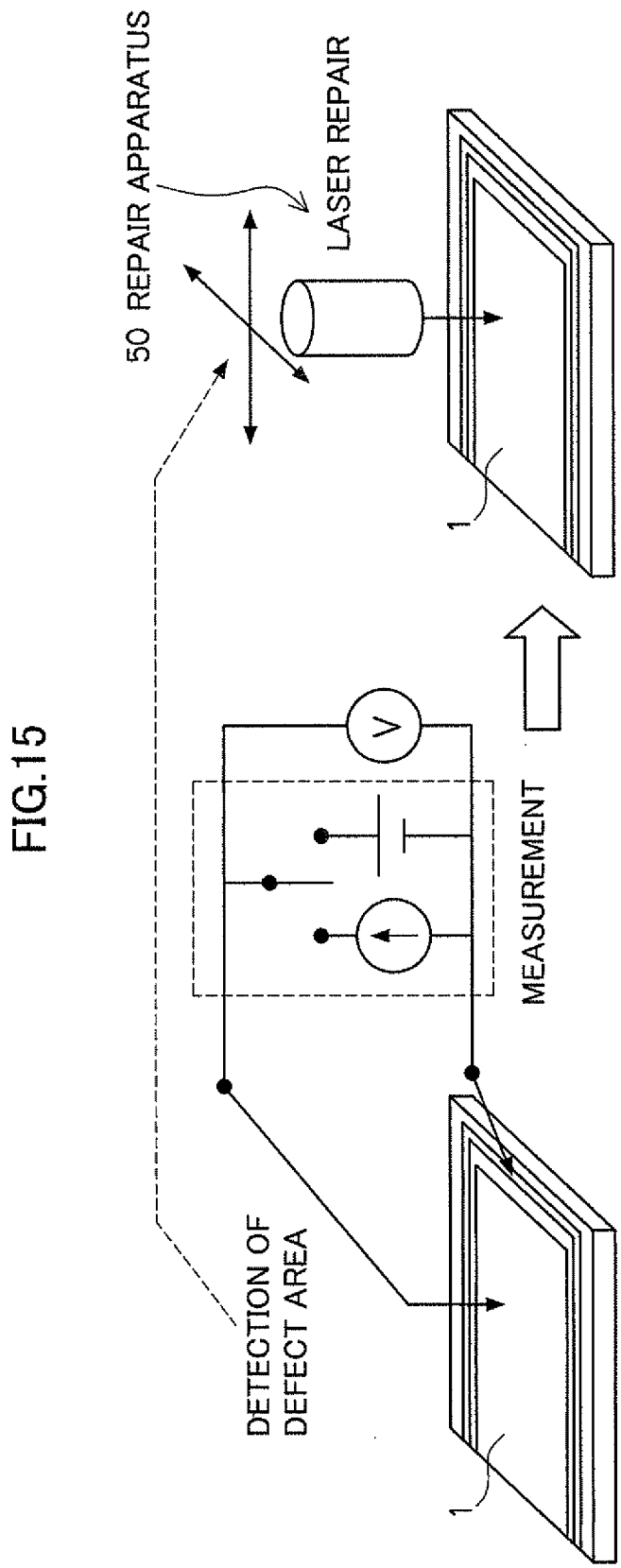
FIG. 15 is an explanatory view showing a method of using evaluation results of the evaluation apparatus according to the embodiments.

(B-5) Moreover, as it is possible to find out the part in the sheet type cell 1 where the measured voltage is abnormal (the defect, for example) by the moving function of the probe or the sheet type cell 1, or by the multi-probe, automatic detection and automatic repair are possible by inputting its location information (identification information of the defect may be added thereto) into a repair apparatus (a laser repair device, for example) 50 (FIG. 15). For example, when a short circuit is caused between the negative electrode 3 and the positive electrode 4 by a local foreign matter, that part is inactivated by the laser. Then, although the electromotive voltage at that part is lost and its power density is slightly reduced, the cell as a whole is protected. As a result, it is possible to improve a yield as a whole.

Figure 16:
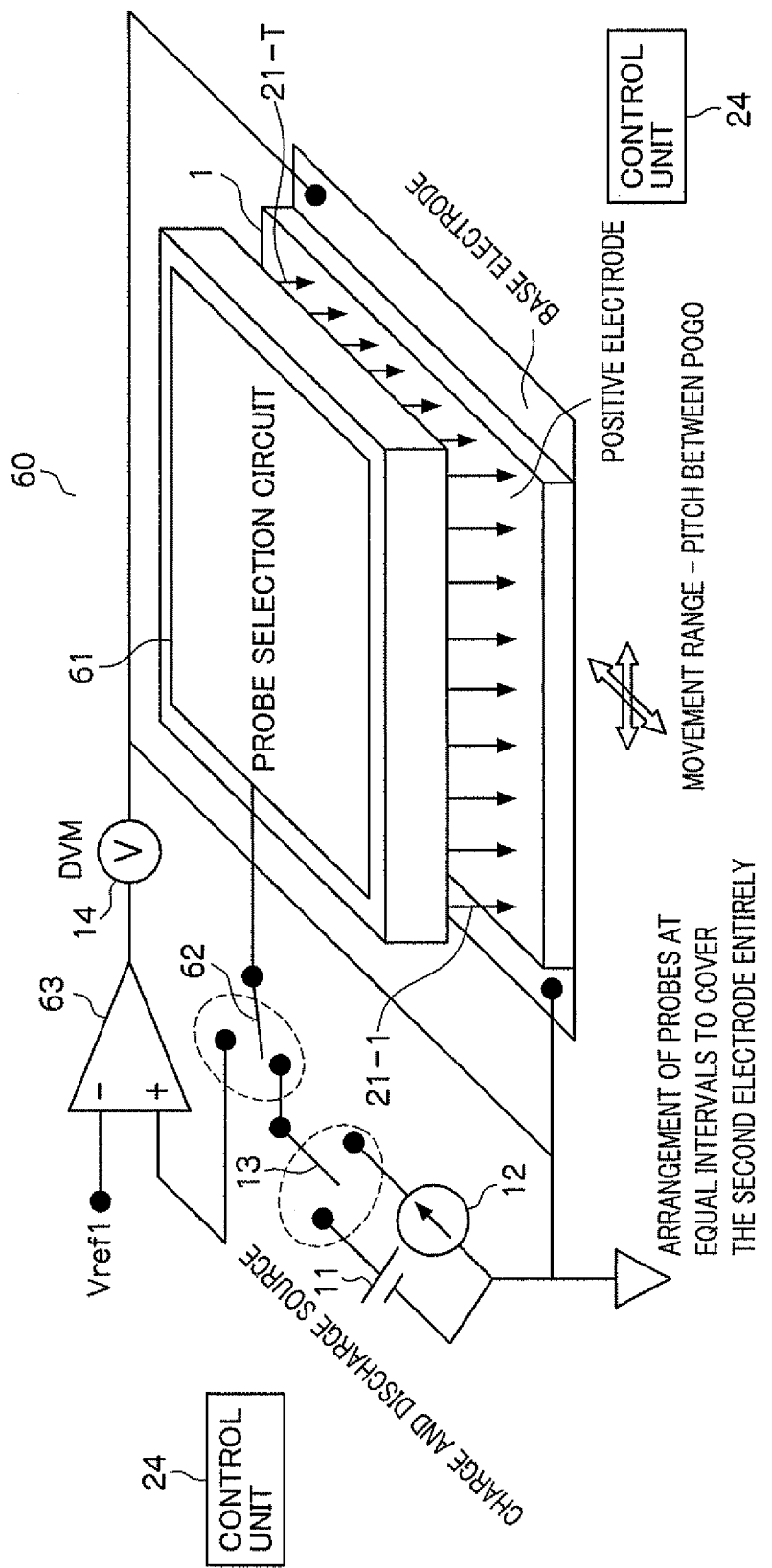
FIG. 16 is an explanatory view showing a variant embodiment in which the evaluation apparatus according to the embodiments is extended to be multi-probe type.

(B-6) FIG. 16 shows an embodiment of an evaluation apparatus to which a multi-probe for measuring voltages at arbitrary parts is applied. Here, the same or corresponding numerals and symbols will be used to designate the same or corresponding components as those in FIG. 5.

In an evaluation apparatus 60 as shown in FIG. 16, a plurality of probes 21-1 to 21-T are arranged at equal intervals lengthwise and widthwise. Base ends of the plurality of probes 21-1 to 21-T with tip ends thereof brought into contact with different parts on the positive electrode 4 of the sheet type cell 1 are connected to a probe selection circuit 61. It is to be noted that the negative electrode 3 of the sheet type cell 1 is set to have a fixed electric potential (grounding, for example). The probe selection circuit 61 is formed by many switches and the like, and selects one probe 21-t, all the probes 21-1 to 21-T, or the probes that are functioning at that moment under the control of the control unit 24. A common input and output terminal of the probe selection circuit 61 is connected to a common terminal of the switch 13 via a switch 62. Similarly to the case in FIG. 5, the switch 13 selects the voltage source (or the current source) 11 or the current source 12. When the voltage source 11 is selected, the charging to the sheet type cell 1 is made. When the current source 12 is selected, the discharging from the sheet type cell 1 is made. The switch 62 selects the switch 13 or a difference circuit 63 under the control of the control unit 24. The difference circuit 63 subtracts a predetermined voltage Vref1 from a pickup voltage of any probe 21-t that is given via the switch 62, and the voltage after the subtraction is measured by the voltage meter (DVM) 14.

The voltage after subtracting the predetermined voltage Vref1 is measured in order to use a dynamic range of the voltage meter 14 effectively and to improve measurement resolution. When the voltage is measured at the plurality of parts, calibration may be made at the respective parts by the predetermined voltage Vref1, so as to minimize an error due to a positional difference between the measurement parts.

Although not shown in FIG. 16, a mounting body of the probes 21-1 to 21-T or a mechanism to move a stage on which the sheet type cell 1 to be measured is mounted can realize the spatial resolution that is smaller than a pitch between the probes and improve throughput of the inspection.

In the example of FIG. 16, the probing of the arbitrary spot on the negative electrode 3 is not made, and the negative electrode 3 is fixedly and stably connected to the evaluation apparatus. However, the probing on the arbitrary spot on the negative electrode 3 side may also be made.

In the example of FIG. 16, one probe 21-t is selected from a group of probes 21-1 to 21-T and the voltage of the probe 21-*t* is measured. However, in order to improve the throughput, a plurality of the difference circuits 63 and the voltage meters (DVM) 14 may be provided so that the picked-up voltages of the plurality of probes are measured in parallel.

(B-7) The evaluation configuration based on the voltage measurement as shown in FIG. 16 and the evaluation configuration based on the current measurement as shown in FIG. 12 may be combined to form one evaluation apparatus.

For example, the voltage (electric potential) may be measured at many parts by using the multi-probe, and the current measurement that can identify the direction and the like may be applied to the part where the measurement electric potential is determined to be abnormal, so as to search for the abnormal part with higher accuracy.

(B-8) In the above-described embodiment, the explanation is given to the case where the sheet type cell 1 functioning as a secondary cell having the configuration as shown in FIG. 1 is evaluated. The above-described evaluation method and evaluation apparatus may be applied even when the cell having the configuration as shown in FIG. 1 is applied as a primary cell.

The invention claimed is:

1. An evaluation method of a sheet type secondary cell for evaluating a charging and/or discharging characteristic of the sheet type secondary cell capable of charging and/or discharging and in which a storage layer that stores electrons during charging operation and that releases the electrons during a discharging operation is sandwiched by layers of a positive electrode and a negative electrode, the evaluation method comprising the step of bringing an electrode probe into electrical contact with a first of a plurality of measurement parts on an outer surface of at least one of the positive electrode and the negative electrode, and measuring an electric characteristic value at the first measurement part, so as to evaluate a charging and/or discharging characteristic of the sheet type secondary cell and to perform identification of an abnormal area in the sheet type secondary cell, wherein the electrode probe is brought into contact with the outer surface of one of the positive electrode and the negative electrode, and a fixed electric potential is applied to the entire electrode of the other of the positive electrode and the negative electrode, wherein a charge source and a voltage meter are connected to the electrode probe, the charge source supplies charging power to the to the first measuring part via the electrode probe, and a charge characteristic is detected from a change in a measurement voltage of the voltage meter as the sheet type secondary cell is charged from a non-charged state to a fully charged state, so as to evaluate the charging and/or discharging characteristic of the sheet type secondary cell, wherein the sheet type secondary cell is divided into said plurality of measurement parts, each having a same size and configuration, wherein the first measurement part is changed to another of the plurality of measurement parts by movement of at least one of the electrode probe and the sheet type secondary cell, and the electric characteristic value is measured at each of the plurality of measurement parts so as to make an evaluation, wherein measurement results and evaluation results at each of the plurality of the measurement parts are output collectively and displayed or printed out as a greyscale image of the secondary cell whose greyscale values are indicative of normality or abnormality for each of the measurement parts.

2. The evaluation method of the sheet type secondary cell according to claim 1, wherein a discharge source and a voltage meter are connected to the electrode probe, the discharge source extracts an electric current via the electrode probe, and a discharge characteristic that changes the sheet type secondary cell from a fully charged state to a non-charged state is detected from a change in a measurement voltage of the voltage meter, so as to evaluate charging and/or discharging characteristic of the sheet type secondary cell.

3. The evaluation method of the sheet type secondary cell according to claim 1, wherein a charge source and a voltage meter are connected to the electrode probe, a discharge source extracts an electric current via the electrode probe, and a measurement voltage of the voltage meter is detected when the sheet type secondary cell is in a fully charged state, so as to evaluate the charging and/or discharging characteristic of the sheet type secondary cell.

4. The evaluation method of the sheet type secondary cell according to claim 1, wherein two or more of the electrode probes for the different measurement parts are provided, a discharge source and a voltage meter that are provided for each of the electrode probes are used, or the discharge source and the voltage meter that are common to the respective electrode probes and are connected, by switching, to each of the electrode probes are used, and a voltage after the charging is measured at the respective measurement parts via the respective electrode probes, so as to evaluate the charging and/or discharging characteristic of the sheet type secondary cell based on magnitude of two or more measurement voltages.

5. The evaluation method of the sheet type secondary cell according to claim 1, wherein the two electrode probes for the different measurement parts are provided, and a current flowing between the two electrode probes is measured by an ammeter, so as to evaluate the charging and/or discharging characteristic of the sheet type secondary cell based on a measurement current.

6. An evaluation method of the sheet type secondary cell according to claim 1, wherein a plurality of the electrode probes that are brought into contact with the outer surface of the positive electrode or the negative electrode, and a probe selection circuit that selects any of the plurality of the electrode probes to form a circuit element of a measurement circuit are provided, and wherein the electrode probes selected by the probe selection circuit measure the electric characteristic value at a plurality of the measurement parts, so as to make an evaluation.

7. An evaluation method of the sheet type secondary cell according to claim 1, wherein the measurement results include a measurement value and a measurement process value for each measurement part, the measurement process value being a difference between a measurement value for a respective part and an average of the measurement values for the plurality of measurement parts, and the measurement process value being compared with a threshold to a respective said measurement part is normal or abnormal.

8. An evaluation apparatus of a sheet type secondary cell for evaluating a charging and/or discharging characteristic of the sheet type secondary cell capable of charging and/or discharging in which a storage layer that stores electrons during charging operation and that releases the electrons during a discharging operation is sandwiched by layers of a positive electrode and a negative electrode, the evaluation apparatus comprising:
an electrode probe that is configured to be brought into electrical contact with a first of a plurality of measurement parts on an outer surface of at least one of the positive electrode and the negative electrode;
a measurement evaluation unit that configured to measure an electric characteristic value at the measurement part via the electrode probe, so as to evaluate the charging and/or discharging characteristic of the sheet type secondary cell and to perform identification of an abnormal area in the sheet type secondary cell;
a charge source connected to the electrode probe;
a relative movement mechanism configured to move at least one of the electrode probe and the sheet type secondary cell so as to allow the first measurement part to change to another of the plurality of measurement parts;
a collective output unit that collectively outputs measurement results and evaluation results at the plurality of the measurement parts for display or print-out as a greyscale image of the secondary cell whose greyscale values are indicative of normality or abnormality for each of the plurality of measurement parts,
wherein the electrode probe is configured to be brought into contact with the outer surface of one of the positive electrode and the negative electrode, and a fixed electric potential is applied to the entire electrode of the other of the positive electrode and the negative electrode,
wherein the charge source supplies charging power to the to the first measuring part via the electrode probe, and the measurement evaluation unit is configured to detect a charge characteristic from a change in a measurement voltage of a voltage meter contained therein as the sheet type secondary cell is charged from a non-charged state to a fully charge state, so as to evaluate the charging and/or discharging characteristic of the sheet type secondary cell,
wherein the sheet type secondary cell is divided into said plurality of measurement parts, each having a same size and configuration,
wherein the first measurement part is changed to another of the plurality of measurement parts by said relative movement mechanism, and the electric characteristic value is measured at each of the plurality of measurement parts so as to make an evaluation, and
wherein measurement results and evaluation results at each of the plurality of the measurement parts are output collectively by the collective output unit for display or print-out.

9. An evaluation apparatus of a sheet type secondary cell according to claim 8, further comprising
a discharge source connected to the electrode probe,
wherein discharge source extracts an electric current via the electrode probe, and the measurement evaluation unit is configured to detect a discharge characteristic that changes the sheet type secondary cell from a fully charged state to a non-charged state from a change in a measurement voltage of a voltage meter contained therein, so as to evaluate the charging and/or discharging characteristic of the sheet type secondary cell.

10. An evaluation apparatus of a sheet type secondary cell according to claim 8, further comprising
a charge source connected to the electrode probe,
wherein the charge source supplies charging power to the to the sheet type secondary cell via the electrode probe, and the measurement evaluation unit is configured to detect a measurement voltage of a voltage meter contained therein when the sheet type secondary cell is in a fully charged state, so as to evaluate the charging and/or discharging characteristic of the sheet type secondary cell.

11. An evaluation apparatus of a sheet type secondary cell according to claim 8, further comprising
two or more of the electrode probes for the different measurement parts,
wherein the measurement evaluation unit is configured to use a discharge source that is provided for each of the electrode probes and a voltage meter contained therein, or to use the discharge source that is common to the respective electrode probes and is connected, by switching, to the electrode probes and the voltage meter contained therein, and measures a voltage after the charging at the respective measurement parts via the respective electrode probes, so as to evaluate the charging and/or discharging characteristic of the sheet type secondary cell based on magnitude of two or more measurement voltages.

12. An evaluation apparatus of a sheet type secondary cell according to claim 8, further comprising
the two electrode probes for the different measurement parts,
wherein the measurement evaluation unit is configured to measure a current flowing between the two electrode probes by an ammeter, so as to evaluate the charging and/or discharging characteristic of the sheet type secondary cell based on a measurement current.

13. An evaluation apparatus of a sheet type secondary cell according to claim 8, further comprising:
a plurality of the electrode probes configured to be brought into contact with the outer surface of the positive electrode or the negative electrode; and
a probe selection circuit configured to select any of the plurality of the electrode probes to form a circuit element of a measurement circuit,
wherein the electrode probes selected by the probe selection circuit are configured to measure the electric characteristic value at a plurality of the measurement parts, so as to make an evaluation by the measurement evaluation unit.

14. An evaluation apparatus of a sheet type secondary cell according to claim 8, wherein the measurement results include a measurement value and a measurement process value for each measurement part, the measurement process value being a difference between a measurement value for a respective part and an average of the measurement values for the plurality of measurement parts, and the measurement process value being compared with a threshold to a respective said measurement part is normal or abnormal.

\* \* \* \* \*